(12) United States Patent
Zhu

(10) Patent No.: US 6,995,958 B2
(45) Date of Patent: Feb. 7, 2006

(54) METHOD FOR SUPPRESSING TRIBOCHARGE IN THE ASSEMBLY OF MAGNETIC HEADS

(75) Inventor: Li-Yan Zhu, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 57 days.

(21) Appl. No.: 11/068,269

(22) Filed: Feb. 28, 2005

(65) Prior Publication Data

US 2005/0168878 A1 Aug. 4, 2005

Related U.S. Application Data

(62) Division of application No. 10/213,561, filed on Aug. 7, 2002, now Pat. No. 6,870,706.

(51) Int. Cl.
*G11B 5/127* (2006.01)

(52) U.S. Cl. .................................... 360/323
(58) Field of Classification Search ............... 360/323, 360/128, 245.8, 245.9, 110, 313, 264.2, 266.3; 29/603.07, 603.13, 603.15, 603.18
See application file for complete search history.

(56) References Cited

U.S. PATENT DOCUMENTS

| | | | |
|---|---|---|---|
| 4,761,699 A | 8/1988 | Ainslie et al. | |
| 4,800,454 A | 1/1989 | Schwarz et al. | |
| 4,972,286 A | 11/1990 | Jurisch et al. | 360/126 |
| 6,267,903 B1 | 7/2001 | Watanuki | 216/22 |
| 6,331,924 B1 | 12/2001 | Takada | 360/323 |
| 6,453,542 B1 | 9/2002 | Zhu | 29/603.07 |
| 6,731,476 B1 * | 5/2004 | Motonishi et al. | 360/323 |
| 6,801,402 B1 * | 10/2004 | Subrahmanyam et al. | 360/245.9 |
| 2003/0210501 A1 * | 11/2003 | Voldman | 360/323 |
| 2004/0017640 A1 * | 1/2004 | Hughbanks et al. | 360/323 |

OTHER PUBLICATIONS

Co-pending U.S. Appl. HT-02-008D, filed Feb. 28, 2005, U.S. Appl. No. 11/068,270, assigned to the same assignee.

* cited by examiner

*Primary Examiner*—Allen Cao
(74) *Attorney, Agent, or Firm*—George O. Saile; Stephen B. Ackerman

(57) ABSTRACT

A method for preventing electrostatic discharge (ESD) damage in the head-suspension assembly (HSA) construction process. The method teaches the formation of a novel GMR magnetic recording head on a conductive slider substrate, the GMR head being electrically connected to the substrate and its conducting leads having balanced resistances between the leads and the substrate. By establishing an electrical connection between the GMR head and the slider substrate, the entire HSA can be grounded during its construction. By also grounding any nearby conducting elements that could inadvertently contact the HSA or its parts, no accumulated tribocharges can discharge through the sensitive GMR sensor element.

4 Claims, 4 Drawing Sheets

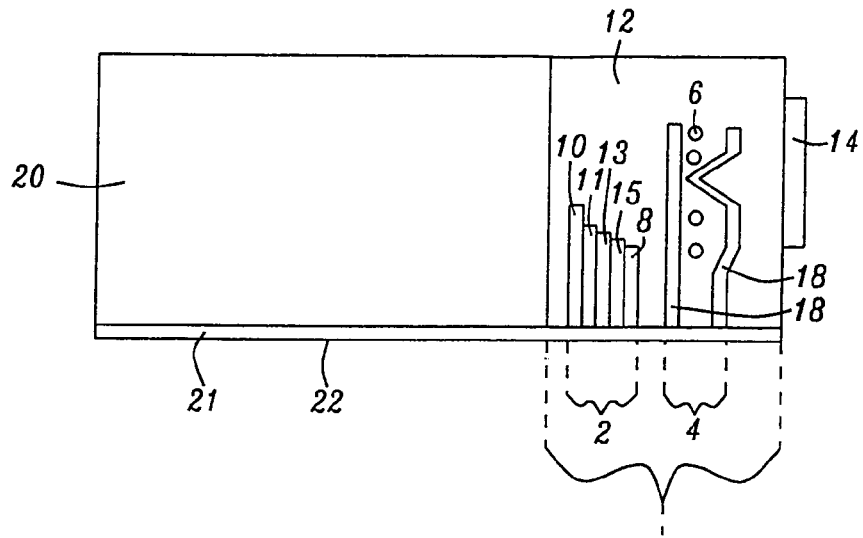
FIG. 1 – Prior Art
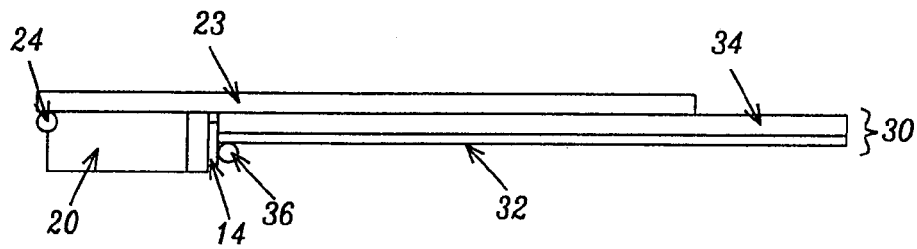
FIG. 2 – Prior Art
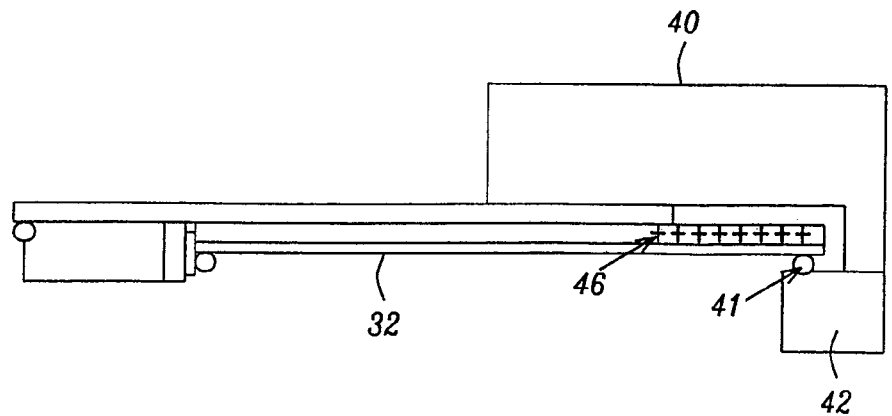
FIG. 3 – Prior Art

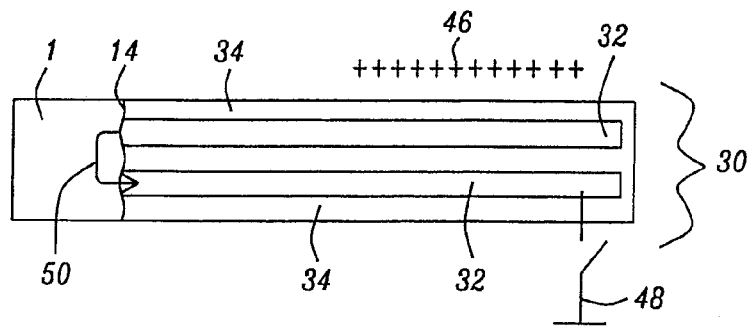
FIG. 4a – Prior Art
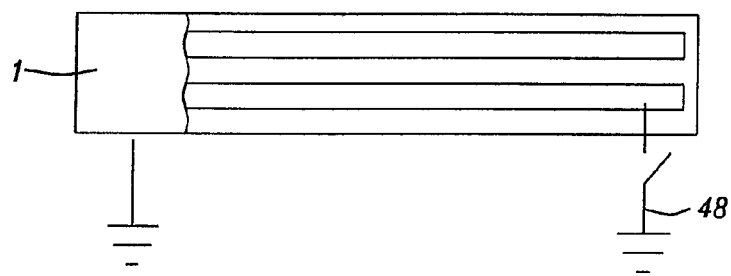
FIG. 4b
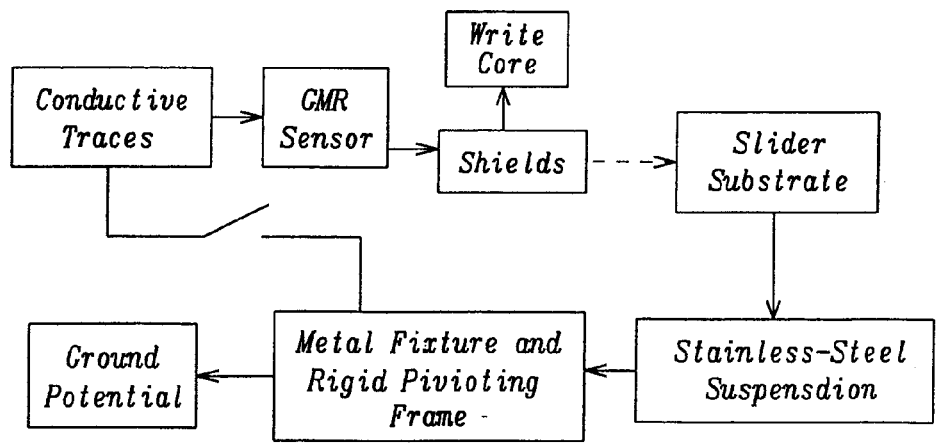
FIG. 5

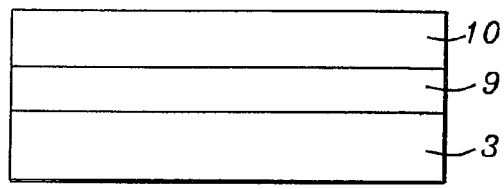
FIG. 6a – Prior Art
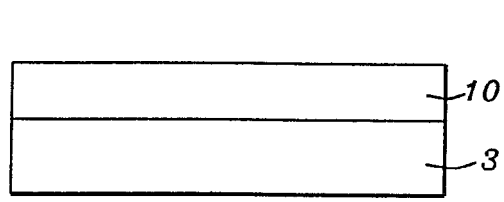
FIG. 6b
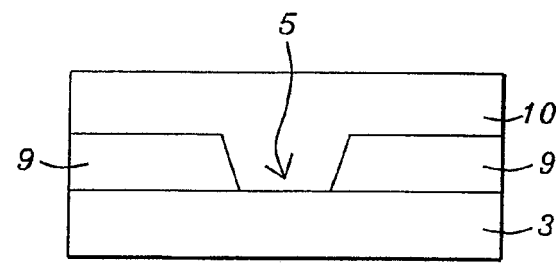
FIG. 6c
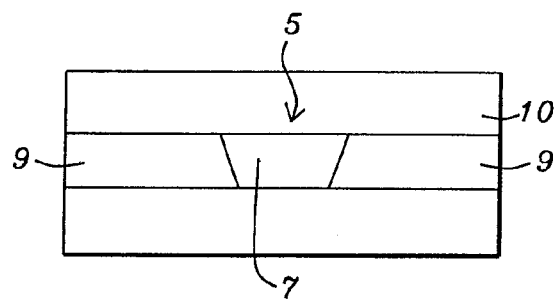
FIG. 6d
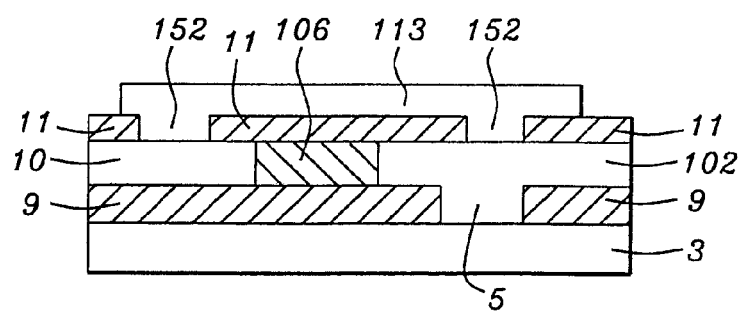
FIG. 6e

METHOD FOR SUPPRESSING TRIBOCHARGE IN THE ASSEMBLY OF MAGNETIC HEADS

This is a division of patent application Ser. No. 10/213,561, filing date Aug. 7, 2002 now U.S. Pat. No. 6,870,706, A Method For Suppressing Tribocharge In The Assembly Of Magnetic Heads, assigned to the same assignee as the present invention, which is herein incorporated by reference in its entirety.

RELATED PATENT APPLICATION

This application is related to Ser. No. 09/514,901, now Issued as U.S. Pat. No. 6,453,542, filing date Feb. 28, 2000, assigned to the same assignee as the current invention.

BACKGROUND OF THE INVENTION

1. Field of the Invention

This invention relates generally to the fabrication of magnetic heads and more particularly to a method of manufacture that eliminates or significantly reduces the occurrence of electrostatic discharge damage to elements of the head during manufacture of the head disk assembly (HDA).

2. Description of the Related Art

A magnetic data recording hard disk drive employs a plurality of electromagnetic transducers, a typical one of the prior art being schematically shown in FIG. 1. In a state-of-the-art disk drive, each transducer (1) further consists of a read-head (2) and a write-head (4). The read-head (2) is typically a sensor whose operation is based on the giant magnetoresistive (GMR) effect and it is extremely sensitive to electrostatic discharge (ESD). The write-head is typically an inductive coil (coil cross-sections shown as (6)), which is fairly immune to ESD. The read head is typically protected from stray electromagnetic fields during operation by an upper shield (8) and an under-shield (10). A first dielectric layer, $D_1$ (11) insulates the under-shield from the GMR element (13), which is the multi-layered sensor that utilizes the GMR effect. A second dielectric layer, $D_2$ (15) insulates the GMR element from the upper shield (8). The shields, dielectric layers and GMR film are sequentially formed on a substrate, which will form a slider (discussed below). The combined read/write-head (transducer) is typically encapsulated in an alumina deposit (12) and conducting leads (not shown) pass through the encapsulation and are connected to terminals (usually gold) (14) on its surface.

As is further shown in prior art FIG. 1, each transducer (1) is mounted on a wear-resistant ceramic carrier (20), commonly called a slider. The write head's magnetic core (18) and the read head's GMR sensor element (13), emerge at a surface of the encapsulating alumina deposit (12) which is co-planar with the surface of the slider (22) called its air-bearing surface (ABS). The surface of the slider is commonly protected by a highly wear-resistant carbon overcoat (COC) (21).

As is shown further in prior art FIG. 2, each slider (20) is mounted on a stainless steel suspension (23) using a conductive adhesive (24), the combination of (20) and (23) forming a head-gimbals assembly (HGA). In a typical manufacturing process, each suspension carries a flexible circuit (30), such as a cable or printed wiring ribbon. The circuit can be schematically depicted as having a plurality of conductive traces (32), of which only one is visible here, and an insulating layer (34). The flexible circuit is firmly attached to the suspension at the end facing the slider, where it is electrically connected to the terminals of the transducer (36). The other end of the flexible circuit will ultimately be connected to a signal processing circuit as discussed below.

Referring next to prior art FIG. 3, a plurality of HGA's (only one being shown in the figure) is attached to a conductive rigid frame (40), to form a head-suspension assembly (HSA). The HSA is then merged (not shown) with a stack of magnetic recording disks to form a head-disk assembly (HDA). At some point in the manufacturing process, electrical connections (41) will be made from each transducer to the HDA signal processing circuit (42). This connection involves the free ends of the flexible circuits whose other ends have been connected to the GMR head. Although FIG. 3 shows the connection as completed, typically by solder re-flow such as is taught by Ainslie et al. (U.S. Pat. No. 4,761,699), there is a period of time in the manufacturing process wherein the freely suspended traces (32) are not yet connected but have been routed to a position whereat connection can be made. The process of routing these trace "tails" into final position is a process wherein tribocharges (33) that have formed will flow and electrostatic discharge (ESD) damage is likely to occur. Referring now to prior art FIG. 4, there is shown a schematic drawing of two of the insulation covered traces (32), and their surrounding insulation (34). The two traces shown represent the connections to the GMR read-head (the write-head connections are not shown) portion of the transducer (1) and are shown as being connected to the terminals at (14). As a result of unavoidable contacts between the insulation and surrounding elements of the fabrication, free electric charges (tribocharges) (46) are generated on the insulation (shown here as positive, but they are of arbitrary sign).

When the free ends of the traces (48) are grounded, either inadvertently or by design (indicated symbolically by a switch), the charge flows through the read-head (shown by the arrow (50)) and ESD damage occurs. To prevent such ESD damage, the two terminals may be shorted at the tails of the traces (the short is not shown, but it would be at (48)). There is also an option of shorting all four traces together, two for the read-head and two for the write-head. This approach has two disadvantages. First, the shunt used to create the short (at (48)) is distant from the read head connection (at (44)). Thus, the characteristic impedance of the transmission line (the two traces) is dominant over the shunt resistance and the shunt is rendered ineffective for dealing with a brief transient event such as the ESD. Second, the shunt must ultimately be removed before the leads can be connected to the HDA circuit, which is not a simple process and must also occur without damage or contamination to the fabrication. In addition, the process of removing the shunt can itself lead to an ESD event.

One alternative to prevent ESD damage from accumulated tribocharge is to subject the fabrication to ionized airflow. This method is ineffective because the time constant for tribocharge to accumulate to damaging levels is on the order of microseconds, whereas the decay time of static charge accumulations in ionized airflow is on the order of seconds. In short, the effect of ionized airflow is too slow to dissipate the tribocharge before an adverse ESD occurs.

Another alternative is to coat or replace the insulator with dissipative material. This adds to the expense of the process. In addition, charge dissipation requires conductivity, so a dissipative "insulator" is slightly conductive, and this can add to cross-talk between the leads to read and write-heads. The need to prevent cross-talk prohibits the use of dissipative insulators that could reduce the time constant for the decay of tribocharge sufficiently to prevent more than between 5% and 50% of the ESD damage to the head-gimbals assembly.

An improvement can be achieved by coating the insulator with a volatile dissipative material, such as isopropyl alcohol. This material will evaporate before actual electrical testing of the assembly, so that cross-talk problems do not arise, yet the required increased dissipation of tribocharge will occur during assembly. A similar approach is to cause water to condense on the insulator, either by blowing hot and humid air on it or by refrigerating the work-piece. These improvements are difficult to achieve because of environmental and operational concerns.

Still another approach is to cover up the ends of the trace tails until they are properly positioned for soldering (at (41) of FIG. 3) so that accidental contact with the surroundings becomes impossible. This, however, is difficult due to the small size of the leads, which are approximately 1 mm wide by 0.1 mm thick. A better alternative is to cover up the conductive rigid frame ((40) in FIG. 3), to eliminate a major region of inadvertent contact. However, this does not prevent the tails from contacting each other and it renders the process of aligning the tails for soldering more difficult.

The greatest challenge in all of the above ESD control methods is to remove tribocharge on the flexible connector circuit rapidly and without adverse side-effects. The presence of tribocharge os independent of the GMR head design. However, as the recording technology continues to evolve and the storage density on recorded media continues to increase, GMR heads will continue to shrink in size and become more susceptible to ESD damage. Competitive GMR heads are routinely ranked by original equipment manufacturer (OEM) customers according to their threshold against ESD damage.

A search of prior art references discloses, in detail, several methods that have been applied to the shielding of magnetic heads. Jurisch et al. (U.S. Pat. No. 4,972,286) teaches a method for grounding a thin film magnetic read/write head by means of a direct connection between the base substrate of the head and a pole of the write head or its core. The connection is made by a conducting stud that extends through a base coat-layer that is sandwiched between the core and the base substrate. This mechanism is proposed as a means of reducing noise during the operation of the read head. Schwarz et al. (U.S. Pat. No. 4,800,454) teaches a method for eliminating arcing between the pole tip of an inductive write head and the flyer (or, in our terminology, the slider) on which it is mounted. The method teaches the dissipation of accumulated static charges by means of a conductive connection between the transducer and the flyer. According to a pertinent embodiment, a low resistance, low current capacity bleeder wire is connected between the windings and the flyer body. After the winding is connected to the circuitry, a large current is passed through the winding to destroy the bleeder. Takada (U.S. Pat. No. 6,331,924) teaches a method of forming an MR head with a capacitor connected in parallel between the head and a substrate wherein the substrate serves as one of the capacitor plates. The object of the method is to provide an alternate path for an ESD current other than through the head itself. Watanuki (U.S. Pat. No. 6,267,903) teaches a method of head fabrication wherein elements of the head are formed on portions of a substrate which has first been been formed an enclosing electrically conductive film. According to the method, static charges produced during the manufacturing process of the various element sections are prevented from passing through the element itself. None of these methods is applicable to the ESD damage problem encountered in the fabrication of heads of the design type discussed above. The method of Jurisch would not be applicable to such a head design and, moreover, the method of Jurisch is directed to protecting the head during actual use. The method of Schwarz is primarily directed to the protection of the coil windings in the inductive write head portion of the GMR head. A burnable wire within the sensitive read-head would not be practical. Takada's approach is to reduce the potential of the magnetic head by a capacitative connection to the substrate. This approach would be inadequate for the product design discussed above. Finally, Watanuki's method assumes the flow of static charges is within the plane of the element formation. Surrounding the element region with a conducting moat would not be practical for the present production method, nor would it eliminate ESD damage that due to tribocharges that pass through the layers of the GMR read-head.

The present invention proposes a significant improvement over the methods of the prior art, particularly when applied to the manufacturing process of a head designed as discussed herein with reference to FIGS. 1–4a. While the insulator ((34) in FIG. 2) cannot be grounded effectively, it is not necessary to remove tribocharge from the insulator. As long as the transducer ((1) in FIG. 1) remains grounded continuously, its potential will be unaffected by the accumulation or dissipation of tribocharge on the insulator or on any nearby conductors. Therefore, in the case of a grounded transducer, it is completely safe for its terminals ((14) in FIG. 1), or any conductors connected to them, to contact any other grounded conductor during assembly. It is, therefore, possible to design a HGA with a low ESD damage threshold in conventional tests, yet which is free of ESD damage during the assembly process.

It is further noted that the primary ground path of the read-head runs through the carbon overcoat (COC) ((21) of FIG. 1), the slider substrate ((20) of FIG. 1), the conductive adhesive ((24) of FIG. 2), to the stainless-steel suspension ((23) of FIG. 2). The suspension is connected to a fixture or a conductive rigid frame, either of which is easily grounded. The resistance, R, of the ground path is dominated by the resistance of the COC, which is typically on the order of mega-ohms. Since the capacitance, C, of the read-head is on the order of pico-farads, the time constant, $\tau=RC$, of static discharge is significantly greater than a microsecond. Therefore, the potential of the read-head is strongly affected by tribocharge.

A novel solution is to connect the read-head to the slider substrate through a much smaller resistance to reduce the time constant. For simplicity, a direct connection with negligible resistance is acceptable. Although we have cited prior art that teaches a connection between the write-head core to the slider substrate (eg. Jurisch and Schwarz cited above), and although connections between a read-head and its shields are also taught (related patent application Ser. No. 09/514,091, fully incorporated herein by reference), no direct connection between the read-head and the slider substrate is taught in the prior art. Superficially, it would seem that this approach is destined to fail. Connecting an additional conducting lead to the read-head should make the read-head even more susceptible to ESD damage, since an additional lead offers an additional source of inadvertent contact with external grounded elements of the system. Indeed, all conventional tests indicate that such an additional lead lowers the threshold for ESD damage to the read-head. However, it is also the case that it is easier to control electrostatic potentials within the environment of the read-head than it is to control the potentials induced by tribocharges on the insulators of the flexible circuit. As long as the read-head remains continuously grounded, a low threshold for ESD damage due to contacts between the charged flexible circuit and its surroundings does not present an appreciable threat. Similarly, when conductors within the surroundings are grounded, there is also a very low threat of ESD damage to the read-head. Thus, a sensible strategy to pursue in suppressing SD damage to the read head during construction of the head-suspension assembly is to maintain the read-head at a very low potential. The more usual approaches of avoiding accidental contacts or strengthening the sensor itself are much less effective.

SUMMARY OF THE INVENTION

The primary object of this invention is to provide a method for suppressing ESD damage to a GMR read-head (or an associated inductive write-head) due to the generation and discharge of accumulated tribocharges on the connecting circuitry during the construction of the head-disk assembly or its various sub-components.

It is a second object of this invention to provide such a suppression method that does not require strengthening the heads to make them more intrinsically resistant to electrostatic discharges.

It is a third object of the present invention to provide such a suppression method that does not require stringent steps for avoiding accidental contacts between the heads and surrounding elements of the assembly or the workplace.

It is a fourth object of the present invention to provide such a suppression-method that is cost effective and easily integrated within the present methods of transducer and disk-head assembly manufacture.

It is a fifth object of the present invention to provide such a suppression method that also reduces the hazard of head degradation caused by tribocharging as a result of interference between the slider and a disk during operation.

It is a sixth object of the present invention to provide such a suppression method that also reduces noise in the readback signal which may arise from tribocharging as a result of interference between the slider and a disk during operation, thereby improving overall head performance.

The method of achieving the objects of this invention will be shown in detail with reference to the processes depicted in FIGS. 1–3 and the concurrent use, therein, of a novel GMR head whose structure is shown in FIGS. 6a–e and 7a–b in the description of the preferred embodiments below. In brief summary, however, to obtain the objects of this invention there is provided a method for electrically connecting the undershield of the GMR read-head ((10) of FIG. 6b) to the wafer substrate ((3) of FIG. 6b). In one embodiment, the undershield is formed directly on the substrate. In a second embodiment, an insulating undercoat is first formed on the substrate and the undershield is formed on the undercoat but contacts the substrate through a via formed in the undercoat. In yet a third embodiment, the undershield is again formed the undercoat, a via is formed in the undercoat and the via is filled with a resistive material. The undershield thereby contacts the substrate through the resistive material. Finally, in a fourth embodiment, the undershield is connected to the wafer substrate through a resistive strip. Since the substrate is also the slider substrate, each of these embodiments allows the undershield to be electrically connected to the slider. Applying methods disclosed in related patent application Ser. No. 09/514,091, filed Feb. 28, 2000 and fully incorporated herein by reference, a GMR sensor element is then electrically connected to an upper shield and the undershield. By means of the above method of head fabrication, the GMR read head is internally electrically connected to the wafer substrate. During the course of the manufacturing process, a plurality of sliders are produced from this wafer. Thus, the GMR sensor is also electrically connected to the slider substrate. The sliders are further processed and made a part of an HGA (head-gimbals assembly). After the read-head terminals on the slider ((14) in FIG. 1) are connected to the flexible circuit ((30) in FIG. 2), the HGA is vulnerable to direct hard-contact with foreign conductors, so it should be handled with grounded dissipative tools, such as dissipative tweezers. Furthermore, all foreign conductors in the workplace vicinity should be grounded. These requirements are already common practice in GMR HGA production lines, so they do not impose an additional burden in the context of the present method.

When the HGA's are mechanically attached to the conductive rigid frame ((40) in FIG. 3) to form a HSA (head suspension assembly), the GMR heads are electrically connected to a common potential. Therefore, contacts between flexible circuit terminals and the rigid frame or any terminals and the rigid frame are harmless. As long as the HDA signal processing circuitry ((42) in FIG. 3) is electrically connected to the same rigid frame as the HGA, there is no ESD hazard when the terminals contact any object in the assembly process. Additionally, the internal connection between the undershield of the GMR sensor and the slider substrate need not be severed after completion of the assembly process as it will provide additional protection against ESD damage and noise during subsequent processes and applications including the normal operation of the unit. Finally, the balanced half-bridge taught in related patent application Ser. No. 09/514,091 and schematically shown in FIGS. 7a–b, provides an effective and advantageous method of electrically connecting the GMR sensor element to its upper and undershields. Not only does this allow the entire head to be grounded during the assembly process, but the head is also protected from shield-to-sensor discharges during the operation of the device.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying figures, wherein:

FIGS. 1–3 (Prior Art) are schematic representations of typical manufacturing steps used in constructing a head-suspension assembly (HSA).

FIG. 4a (Prior Art) is a schematic representation of a GMR sensor and attached conducting cable showing the accumulation of tribocharges and a typical path of discharge current that would cause ESD damage to the sensor.

FIG. 4b shows the same representation as in 4a, but the GMR sensor is now grounded in accordance with the method of the present invention.

FIG. 5 is a flow chart schematic showing how the method of the present invention prevents ESD damage during HSA assembly.

FIG. 6a (Prior Art) and FIGS. 6b–e provide a schematic representation of the formation of a GMR sensor and read head in accordance with four embodiments of the present invention.

DESCRIPTION OF THE PREFERRED EMBODIMENTS

Figure 7A:
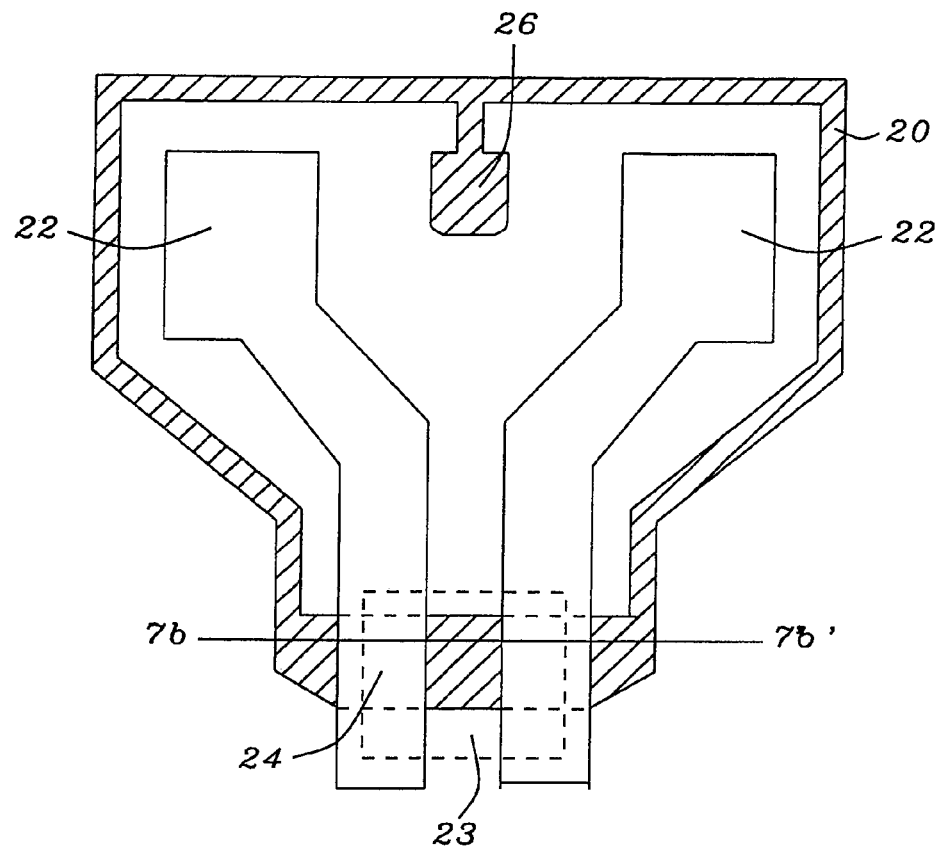
FIGS. 7a and 7b provide schematic overhead and cross-sectional views of a balanced half-bridge, providing an electrical connection between a GMR sensor and its upper and undershields as taught in related patent application Ser. No. 09/514,091.

The preferred embodiments of the present invention provide methods of internally connecting a giant magnetoresistive (GMR) sensor element to its shields and substrate and a method of using the GMR read head so formed in the fabrication of a magnetic head suspension assembly (HSA) in a manner that suppresses electrostatic discharge (ESD) damage caused by the discharge of accumulated tribocharges during the construction of said HSA. Discussion of FIGS. 1–3 above have already detailed the general manufacturing process of a head suspension assembly. The method of the present invention incorporates the use of a novel GMR magnetic head design into the manufacturing process in a manner that suppresses electrostatic damage.

Referring first to 4a there is shown a schematic diagram to illustrate the mechanism by which accumulated tribocharges on a connecting cable discharge through a GMR head not formed according to the present invention (here, we use the term "GMR head" to indicate a read/write transducer incorporating a GMR sensor element) and cause severe electrostatic discharge (ESD) damage. The GMR head (1) has been attached to a flexible, insulated conducting cable (30) (also called, more generally, a conducting circuit) at connecting pads or terminals (not shown). The cable typically contains four conducting traces, of which only the two (32) that are connected to the GMR read head portion are shown. There are also two traces that would connect to the inductive write head, but these are not indicated. The traces are separated from the stainless steel suspension ((23) in FIG. 2) by a layer of insulation (34). In some, but not all designs, insulation may also be applied to cover the traces (32) over at least a portion of their length. An accumulation of tribocharges (46) are shown on the surface of the insulator; these tribocharges accumulate as a result of unavoidable contact and friction between the insulator and its surroundings. A grounded switch (48) is shown at the end of the cable distant from the sensor to symbolize the possibility of inadvertent grounding of one of the traces. Closing the symbolic switch corresponds to the cable touching a grounded conductor in the workplace, at which time the accumulated charges will flow through the GMR sensor as indicated by the curved arrow (50).

Referring next to FIG. 4b, there is shown the same cable as in FIG. 4a, but the attached GMR head (1) is now internally grounded (through the slider substrate) in accord with the method of the invention. The internal connections between the GMR sensor element and the sensor shields (which will be shown in detail in FIGS. 6a–e) allow the head as a whole to be grounded to the HGA. If the symbolic switch (48) is now closed by inadvertent grounding, there is no flow of charge through the head.

Referring next to FIG. 5, there is shown a flow chart diagram indicating how the novel grounded GMR head suppresses ESD damage. The solid arrows represent connections and process steps of the prior art, the dashed arrow represents the novel process step of the present invention and the open switch represents the possibility of inadvertent contact between the conducting traces and a grounded metal fixture within the HGA. Following the flow, we have the following process steps which form one isolated unit: conductive traces are connected to the GMR head which contains a GMR sensor element, shields and a write core. Without the electrical connection to the slider substrate (of the present invention) implied by the dashed arrow, this is an electrically isolated unit. A second electrically isolated unit formation corresponds to the portion of the flow chart in which the slider substrate is connected to the stainless-steel suspension, which is, in turn, connected to a metal fixture and rigid pivoting frame which is grounded. If the switch between the conductive traces and the metal fixture is closed, the two units are connected and charge flows through the GMR head. With the dashed arrow in place in accord with the present invention, the GMR sensor, shields and write core are electrically connected to the slider substrate and closing the switch does not cause the flow of charge.

Referring now to FIG. 6a, there is shown a schematic cross section of a partially constructed GMR head and the process of forming it in accord with the prior art. There is first provided a wafer substrate (3) of a conductive material. This substrate will ultimately be partitioned into a plurality of slider substrates ((20) in FIG. 1) after the wafer process is complete. In the prior art, an electrically insulating layer (9) such as alumina is first formed upon the wafer substrate (3). This insulating layer is often called the undercoat. It is typically between 1 and 5 micron in thickness. Then a first electrically conductive magnetic shield, typically between 1 and 3 microns in thickness and formed of a material containing approximately 80% Ni and 20% Fe, is formed upon the undercoat (9). This first shield is often called the undershield (10). Typically, the undershield (10) is deposited by first vacuum sputtering a conductive seed-layer (not shown) onto the undercoat (9), then electroplating the bulk of the thickness in patterns previously defined by a photo mask (not shown). Clearly, the prior art described above is aimed at isolating the undershield (10) electrically from the substrate (3).

Referring now to FIG. 6b, there is shown a schematic cross section of a partially constructed GMR head and a process of forming it in accord with the present invention. The undercoat ((9) of FIG. 6a) used in the prior art is eliminated. The same undershield (10) is now formed directly upon substrate (3), without the undercoat. It is understood that the optimal composition, thickness, and condition of depositing the seed-Layer may differ from that in the prior art. This is because adhesion to the undercoat generally differs from adhesion to the substrate (3). However there are multiple solutions which are known to those skilled in the art of vacuum processes and are beyond the scope of the present invention. FIG. 6b represents a preferred embodiment which results in modest saving in the time and cost of production.

A second embodiment of the present invention is shown with reference to FIG. 6c. There is first provided a wafer substrate (3) of a conductive material. As in the prior art, an undercoat (9) is first formed upon the wafer substrate (3). However unlike the prior art, a via hole (5) is formed through the undercoat (9) before the undershield (10) is formed upon the undercoat (9). However a portion of the undershield (10) extends through the via hole (5) and is attached to the substrate (3). Since the via hole (5) is small compared to the entire undershield (10), adhesion to the substrate is not as critical as in the preferred embodiment depicted in FIG. 6b. Therefore no modification of the seed-layer is needed. This embodiment requires an additional process of forming via hole (5), compared with the prior art. Thus it results in slightly longer process time and slightly higher cost of production. However this embodiment preserves the geometrical dimension of the slider. It is useful when the present invention is implemented in an existing product.

The second embodiment shown in FIG. 6c also permits a third embodiment a large resistance to be inserted between undershield (10) and substrate (3). As shown in FIG. 6d, a layer of electrically resistive material such as polycrystalline silicon (7), can be deposited in the via hole (5), between undershield (10) and substrate (3). The resistance can be adjusted by the size of the via hole (5), thickness of the silicon, and doping of the silicon. Ideally, a resistance around 100 kilo Ohm provides an adequate grounding effect for suppressing tribocharge on the flexible circuit (30), while providing some protection against ESD damage caused by the symbolic switch ((48) in FIG. 4a) being connected to a conductor having an electrostatic potential distinct forming the potential of suspension (23). However in practice, it is relatively easy to control the electrical potential of conductors which may come in contact with the GMR sensor, either through traces (32), or directly at the air bearing surface (22). On the other hand, it is more difficult to create the desired large resistance. Therefore inserting a large resistance is an option which may or may not be appealing depending upon the overall fabrication process.

Referring to FIG. 6e, there is shown a fourth embodiment. In this embodiment an undercoat (9) is first formed over a wafer substrate (3). Then a redundant undershield (102) is formed simultaneously with, but distant from the first undershield (10). A via hole (5) is made under the redundant undershield (102) only, not under the first undershield (10). An insulating material such as alumina is deposited over shields (10) and (102), also fitting the gap between them (106). The insulating material is subsequently lapped to expose the upper surfaces of the undershields (10) and (102), but leaving the fill (106) remaining between the undershields. Another insulating layer, $D_1$ (11) is deposited over each undershield (10) and (102). Two via holes (152) are formed in $D_1$ (1), one hole over each undershield (10) and (102). A strip of resistive material (113), which could be the GMR film itself, is formed over $D_1$, passing through both via holes and electrically connecting undershields (10) and (102) through a large resistance, typically on the order of approximately 10 kOhm (10,000 Ohms). The resistance of strip (113) is determined by the thickness of the strip (the GMR film thickness if it forms the strip) and the strip's aspect ratio (ratio of length to width). Therefore, the resistance of the strip can be made more precisely than that of the resistive material of the third embodiment. Furthermore, connecting undershield (10) to the substrate (3) through strip (113) as described above does not require new or additional processes, other than minor changes in masks, compared with the prior art of GMR wafer manufacture, so it can be done with minimal additional cost.

Each of the above four embodiments provides a method for electrically connecting the undershield (10) to the slider substrate (3). To complete the fabrication, it is necessary to form a GMR sensor element on the undershield, form conducting leads abutting or overlaying the sensor element and form an upper shield over the sensor element, leads and biasing layers. The upper shield, the sensor element and the undershield must then be electrically connected to each other, which would thereby electrically connect the entire fabrication to the substrate to meet the objectives of the invention. Although the present invention comprises the methods of forming the connection between undershield and substrate, an appropriate and advantageous method for connecting the GMR sensor and upper shield to the undershield can be found described in Ser. No. 09/514,091, filed Feb. 28, 2000, which is fully incorporated herein by reference. The method taught therein provides the advantages of a balanced half-bridge connection between the upper shield, the undershield and the conductive lead layers such that the resistance between each lead layer and the undershield is substantially equal. Referring then to FIG. 7a, there is shown a schematic overhead view of the balanced half-bridge of Ser. No. 09/514,091. Conducting leads (22) are formed abutting (or overlaying) the GMR sensor element (23) (shown crosshatched). The material of the sensor element is then extended, to form the shape (20), which is shaded by cross-hatching. This is the half-bridge. At the rear of this half bridge there is a pad (26) to which will be attached conducting interconnects to an upper shield (which is above the plane of the figure and not shown) and to the undershield, (which is below the plane of the figure and also not shown). Insulating dielectric layers are formed between the plane of the figure and the upper and undershields. The conducting interconnects pass through vias in the dielectric layers.

Figure 7B:
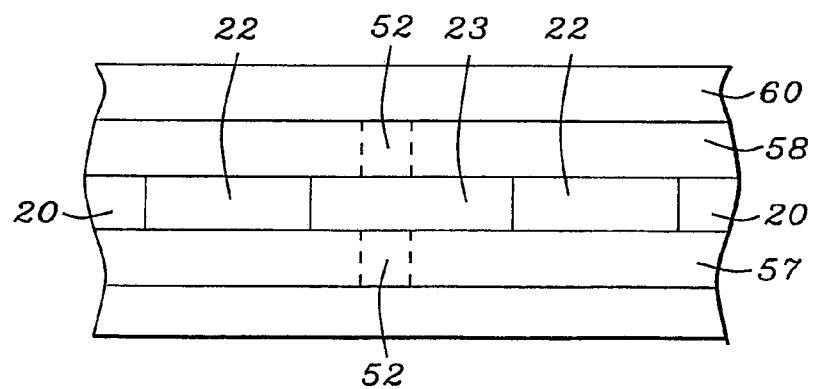

FIG. 7b shows a highly schematic cross-sectional view taken through the line A–A' in FIG. 7a. In FIG. 7b there can be seen the upper shield (60), the dielectric layer (58) between the upper shield and the sensor element, the sensor element (23), the leads (22), the balanced half-bridge extending from the sensor element (20), a dielectric layer (57) between the sensor element and the undershield (10). Vias (52) behind the plane of the figure, allow the passage of interconnects between the pad ((26) in FIG. 7a) and the upper shield and undershield.

As is understood by a person skilled in the art, the preferred embodiments of the present invention are illustrative of the present invention rather than limiting of the present invention. Revisions and modifications may be made to methods, materials, structures and dimensions employed in the present method for suppressing electrostatic discharge (ESD) damage during the construction of an HSA, while still providing a method for suppressing electrostatic discharge (ESD) damage during the construction of an HSA, in accord with the spirit and scope of the present invention as defined by the appended claims.

What is claimed is:

1. A method for preventing electrostatic discharge (ESD) damage during the head-suspension assembly (HSA) construction process, comprising:

providing a plurality of sliders, each slider having a conductive substrate, and an equal number of GMR magnetic recording heads, each said GMR magnetic recording head comprising:

a conductive substrate;

an electrically conductive under shield formed on the substrate, said under shield being in electrical contact with the substrate;

a first insulating layer formed on the under shield;

a GMR sensor element formed on said first insulating layer;

conducting lead layers formed electrically contacting said sensor element;

a second insulating layer formed over said sensor element and said conducting lead layer;

an electrically conducting upper shield formed on said second insulating layer, said electrically conducting upper shield being electrically connected to the sensor element and to said undershield through a balanced half bridge, whereby the balanced half bridge produces substantially equal resistances between said leads and said conductive substrate; and a plurality of terminals for making connections to said GMR magnetic recording head;

attaching each slider to one end of a conductive suspension to form, thereby, a plurality of head-gimbals assemblies (HGA's), there being also attached to each said suspension a conductive circuit, said circuit comprising a plurality of conducting traces insulated from said suspension and said circuit having a first end with a plurality of connective terminals facing the slider and a second end with a plurality of connective terminals facing an end of the suspension opposite to the end on which the slider is attached;

connecting the terminals on the magnetic recording head formed on each slider mounted on its HGA to the terminals on the first end of the conductive circuit;

establishing electrical connection between said conductive slider substrate and said conductive suspension on each of said head-gimbals assemblies (HGA's);

attaching each of said plurality of HGA's to a conductive rigid frame, said conductive rigid frame having a signal processing circuit, to form, thereby, a head-suspension assembly (HSA), all said suspensions on said HSA being electrically connected to said conductive rigid frame;

connecting said second end of all said conductive circuits to said signal processing unit;

connecting said conductive rigid frame to a ground potential;

connecting all external conductive surfaces which electrically contact said suspensions to said ground potential.

2. A method for preventing electrostatic discharge (ESD) damage during the head-suspension assembly (HSA) construction process, comprising:

providing a plurality of sliders, each slider having a conductive substrate, and an equal number of GMR magnetic recording heads, each said GMR magnetic recording head comprising:

a conductive substrate;
an insulating undercoat formed on said substrate;
a via formed through said undercoat;
an electrically conductive under shield formed on the substrate, a portion of said under shield passing through said via and forming an electrical contact with the substrate;
a first insulating layer formed on the under shield;
a GMR sensor element formed on said first insulating layer;
conducting lead layers formed electrically contacting said sensor element;
a second insulating layer formed on said sensor element and said conducting lead layer;
connecting said conductive rigid frame to a ground potential;
connecting all external conductive surfaces which electrically contact said suspensions to said ground potential.

3. A method for preventing electrostatic discharge (ESD) damage during the head-suspension assembly (HSA) construction process, comprising:

providing a plurality of sliders, each slider having a conductive substrate, and an equal number of GMR magnetic recording heads, each said GMR magnetic recording head comprising:

a conductive substrate;
an insulating undercoat formed on said substrate;
a via formed through said undercoat;
a resistive connection formed within said via contacting said substrate;
an electrically conductive under shield formed on the undercoat, said under shield contacting said resistive connection and thereby making electrical contact with the substrate;
a first insulating layer formed on the under shield;
a GMR sensor element formed on said first insulating layer;
conducting lead layers formed electrically contacting said sensor element;
a second insulating layer formed on said sensor element and said conducting lead layer;
an electrically conducting upper shield formed on said second insulating layer wherein the electrically conducting upper shield is electrically connected to
an electrically conducting upper shield formed on said second insulating layer wherein the electrically conducting upper shield is electrically connected to the sensor element and to the under shield by a balanced half bridge that produces substantially equal resistances between said leads and said conductive substrate;
a plurality of terminals for making connections to said GMR magnetic recording head;

attaching each slider to one end of a conductive suspension to form, thereby, a plurality of head-gimbals assemblies (HGA's), there being also attached to each said suspension a conductive circuit, said circuit comprising a plurality of conducting traces insulated from said suspension and said circuit having a first end with a plurality of connective terminals facing the slider and a second end with a plurality of connective terminals facing an end of the suspension opposite to the end on which the slider is attached;

connecting the terminals on the magnetic recording head formed on each slider mounted on its HGA to the terminals on the first end of the conductive circuit;

establishing electrical connection between said conductive slider substrate and said conductive suspension on each of said head-gimbals assemblies (HGA's);

attaching each of said plurality of HGA's to a conductive rigid frame, said conductive rigid frame having a signal processing circuit, to form, thereby, a head-suspension assembly (HSA), all said suspensions on said HSA being electrically connected to said conductive rigid frame;

connecting said second end of all said conductive circuits to said signal processing unit;

the sensor element and to the under shield by said balanced half bridge that produces substantially equal resistances between said leads and said conductive substrate;

a plurality of terminals for making connections to said GMR magnetic recording head;

attaching each slider to one end of a conductive suspension to form, thereby, a plurality of head-gimbals assemblies (HGA's), there being also attached to each said suspension a conductive circuit, said circuit comprising a plurality of conducting traces insulated from said suspension and said circuit having a first end with a plurality of connective terminals facing the slider and a second end with a plurality of connective terminals facing an end of the suspension opposite to the end on which the slider is attached;

connecting the terminals on the magnetic recording head formed on each slider mounted on its HGA to the terminals on the first end of the conductive circuit;

establishing electrical connection between said conductive slider substrate and said conductive suspension on each of said head-gimbals assemblies (HGA's);

attaching each of said plurality of HGA's to a conductive rigid frame, said conductive rigid frame having a signal processing circuit, to form, thereby, a head-suspension assembly (HSA), all said suspensions on said HSA being electrically connected to said conductive rigid frame;

connecting said second end of all said conductive circuits to said signal processing unit;

connecting said conductive rigid frame to a ground potential;

connecting all external conductive surfaces which could electrically contact said suspensions to a ground potential.

4. A method for preventing electrostatic discharge (ESD) damage during the head-suspension assembly (HSA) construction process, comprising:

providing a plurality of sliders, each slider having a conductive substrate, and an equal number of GMR magnetic recording heads, each said GMR magnetic recording head comprising:

a conductive substrate;

an insulating undercoat formed on said substrate;

a via formed through said undercoat;

a shield layer formed on said undercoat, said shield layer being formed as two horizontally disjoint first and second shield portions separated by a first insulating layer and planarized to form a common planar upper surface and wherein the material of said second shield portion passes through the via hole in said undercoat and contacts, thereby, the conducting substrate;

a second insulating layer formed on said shield layer;

two via holes formed in said second insulating layer, one of said via holes being above said first shield portion and the other one of said via holes being above said second shield portion;

a resistive strip formed on said second insulating layer, said strip electrically contacting the first and second shield portions through said via holes;

a third insulating layer formed over said resistive strip and said second insulating layer;

a GMR sensor element formed on said third insulating layer;

conducting lead layers formed electrically contacting said sensor element;

a fourth insulating layer formed on said sensor element and said conducting lead layers;

an electrically conducting upper shield formed on said fourth insulating layer wherein the electrically conducting upper shield is electrically connected to the sensor element and to the shield layer by a balanced half bridge that produces substantially equal resistances between said leads and said conductive substrate;

a plurality of terminals for making connections to said GMR magnetic recording head;

attaching each slider to one end of a conductive suspension to form, thereby, a plurality of head-gimbals assemblies (HGA's), there being also attached to each said suspension a conductive circuit, said circuit comprising a plurality of conducting traces insulated from said suspension and said circuit having a first end with a plurality of connective terminals facing the slider and a second end with a plurality of connective terminals facing an end of the suspension opposite to the end on which the slider is attached;

connecting the terminals on the magnetic recording head formed on each slider mounted on its HGA to the terminals on the first end of the conductive circuit;

establishing electrical connection between said conductive slider substrate and said conductive suspension on each of said head-gimbals assemblies (HGA's);

attaching each of said plurality of HGA's to a conductive rigid frame, said conductive rigid frame having a signal processing circuit, to form, thereby, a head-suspension assembly (HSA), all said suspensions on said HSA being electrically connected to said conductive rigid frame;

connecting said second end of all said conductive circuits to said signal processing unit;

connecting said conductive rigid frame to a ground potential;

connecting all external conductive surfaces which electrically contact said suspensions to said ground potential.

* * * * *